United States Patent
Miura

(10) Patent No.: US 7,733,128 B2
(45) Date of Patent: Jun. 8, 2010

(54) TRANSMITTING APPARATUS

(75) Inventor: Satoshi Miura, Tokyo (JP)

(73) Assignee: Thine Electronics, Inc., Tokyo (JP)

( * ) Notice: Subject to any disclaimer, the term of this patent is extended or adjusted under 35 U.S.C. 154(b) by 50 days.

(21) Appl. No.: 11/912,800

(22) PCT Filed: Apr. 25, 2006

(86) PCT No.: PCT/JP2006/308614
§ 371 (c)(1), (2), (4) Date: Oct. 26, 2007

(87) PCT Pub. No.: WO2006/120889
PCT Pub. Date: Nov. 16, 2006

(65) Prior Publication Data
US 2009/0033365 A1    Feb. 5, 2009

(30) Foreign Application Priority Data
May 2, 2005    (JP) .............................. 2005-134369

(51) Int. Cl.
*H03K 19/094* (2006.01)
*H03K 19/0175* (2006.01)
(52) U.S. Cl. .............................. 326/86; 326/90; 326/115
(58) Field of Classification Search .................. 326/86, 326/90, 115, 126–127
See application file for complete search history.

(56) References Cited
U.S. PATENT DOCUMENTS
6,281,715 B1 * 8/2001 DeClue et al. ................ 327/65
6,940,302 B1 * 9/2005 Shumarayev et al. ......... 326/26
6,977,534 B2 * 12/2005 Radelinow .................. 327/112

FOREIGN PATENT DOCUMENTS
| JP | 2002-368600 A | 12/2002 |
| JP | 2004-112453 A | 4/2004 |
| JP | 2004-312614 A | 11/2004 |
| JP | 2004-357004 A | 12/2004 |

* cited by examiner

*Primary Examiner*—Anh Q Tran
(74) *Attorney, Agent, or Firm*—Sughrue Mion, PLLC

(57) ABSTRACT

To provide a transmitting apparatus capable of suppressing the fluctuation of a common mode potential and performing high-speed, long-distance signal transmission. The transmitting apparatus has a main buffer circuit and a pre-emphasis buffer circuit 20. The pre-emphasis buffer circuit 20, which has a switch circuit 21, a first current source 22, and a second current source 23, uses the switch circuit 21 to output a current signal having the same direction as an output current of the main buffer circuit 10 during a certain time interval starting from a time point when the level of data to be transmitted changes, and brings the output terminals 201, 202 to a High-Z state during a time interval when the level is constant after a lapse of the abovementioned certain time interval. The output of the pre-emphasis buffer circuit 20 has no influence on the common mode potential of the output of the main buffer circuit but has influence only the amplitude of the current signal output to a differential transmission line. In this manner, the transmitting apparatus can suppress the fluctuation of the common mode potential and can perform high-speed, long-distance signal transmission.

3 Claims, 15 Drawing Sheets

Fig.7

| OUTPUT STATE OF PRE-EMPHASIS BUFFER CIRCUIT 20 | INPp | INPn | INNp | INNn |
|---|---|---|---|---|
| H | H(off) | L(off) | L(on) | H(on) |
| L | L(on) | H(on) | H(off) | L(off) |
| High-Z | H(off) | L(off) | H(off) | L(off) |

Fig.9

| OUTPUT STATE OF PRE-EMPHASIS BUFFER CIRCUIT 20 | INPp | INPn | INNp | INNn | STATE OF VOLTAGE-HOLDING CIRCUIT 24 |
|---|---|---|---|---|---|
| H | H(on) | L(on) | L(off) | H(off) | NO CURRENT FLOWS TO RESISTORS 245, 246 |
| L | L(off) | H(off) | H(on) | L(on) | NO CURRENT FLOWS TO RESISTORS 245, 246 |
| High-Z | H(on) | L(on) | H(on) | L(on) | CURRENT FLOWS TO RESISTORS 245, 246 |

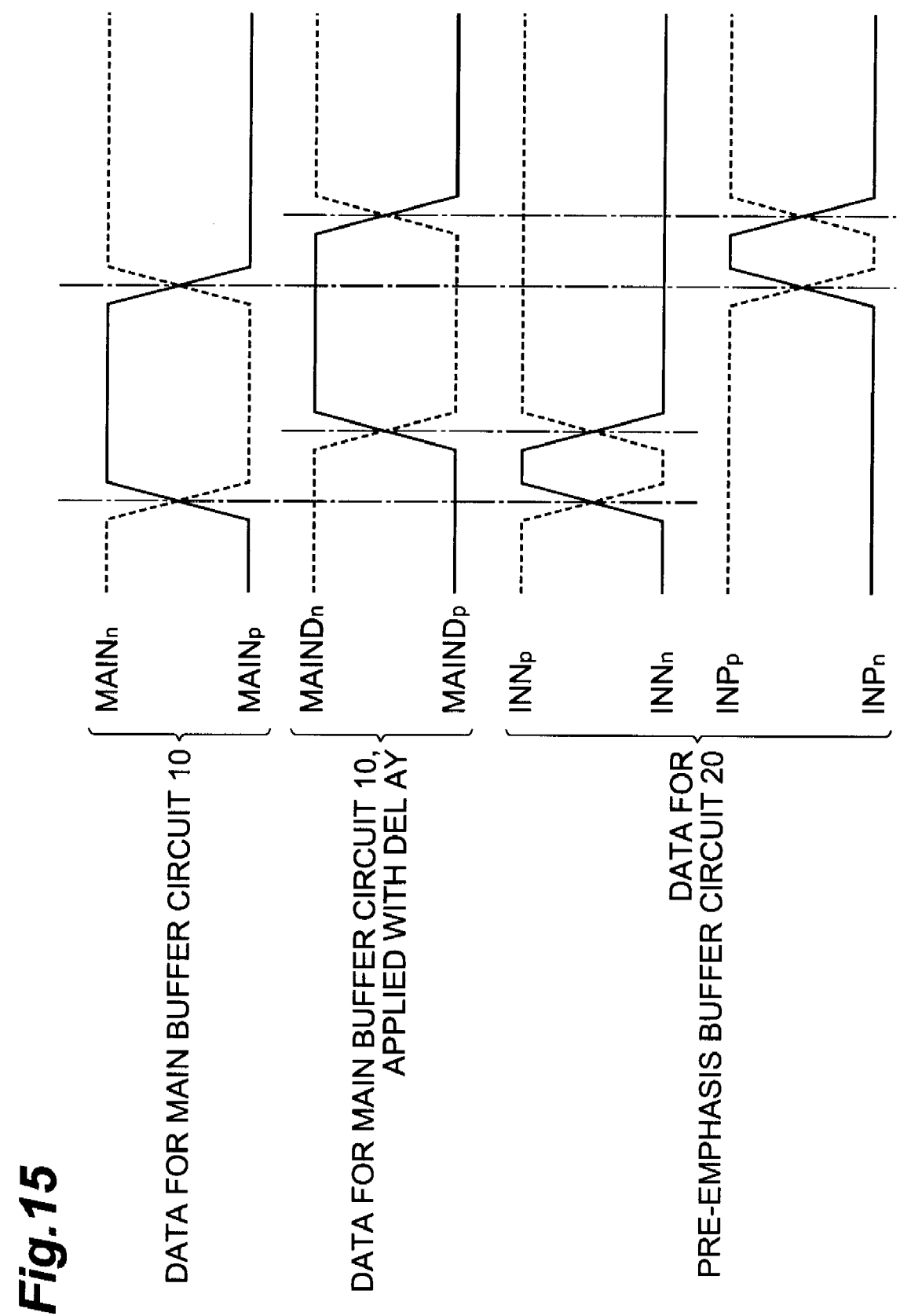

ized as IEEEP1596, 3, is used for
TRANSMITTING APPARATUS

TECHNICAL FIELD

The present invention relates to a transmitting apparatus that can be used suitably in a low-voltage differential signaling (LVDS) system for transmitting and receiving a digital signal by changing the directions of a current flowing in a pair of resistor-terminated differential transmission lines.

BACKGROUND ART

LVDS, which is standardized as IEEEP1596, 3, is used for transmitting a digital signal by changing the directions of a current flowing in a pair of resistor-terminated differential transmission lines, and is generally capable of transmitting the digital signals at high speed and with low power consumption and less noise.

A transmitting apparatus that is used in LVDS has a first output terminal and a second output terminal that are connected to a pair of differential transmission lines, wherein when a digital signal to be transmitted is at an H level, a current signal flowing from the first output terminal to the second output terminal via the pair of differential transmission lines is output, and when the digital signal to be transmitted is at an L level, a current signal flowing from the second output terminal to the first output terminal via the pair of differential transmission lines is output.

Incidentally, when performing high-speed, long-distance signal transmission, a problem arises in which the bit error rate obtained at the time of reception is increased due to attenuation of the AC component of a signal in the differential transmission lines. Specifically, when the level of a digital signal to be transmitted is inverted and thereby the directions of the current signals that are output from the first output terminal and second output terminal of the transmitting apparatus are inverted, it requires time for the magnitude of the current signals to reach a predetermined value after the inversion, and, as a result, a reception error easily occurs on the receiving apparatus side.

Patent Document 1 discloses an invention for solving such problems. The transmitting apparatus of the invention disclosed in Patent Document 1 has the magnitude of a current signal exceed the predetermined value during a certain time interval after inverting the direction of the current signal that is output from the first output terminal to the second output terminal, to thereby reduce the time required for the magnitude of the current signal to reach the predetermined value after the inversion.

[Patent Document 1]

Japanese Unexamined Patent Application Publication No. 2002-368600

The transmitting apparatus of the invention disclosed in Patent Document 1 has an active element for performing current control on a current source, and a passive element for performing voltage signal on a current sink, in order to have the magnitude of the current signal exceed the predetermined value during a certain time interval after inverting the direction of flow of the current signal. Since the transmitting apparatus performs both current control and voltage control, a problem arises in which the common mode potential fluctuates easily and EMI (electromagnetic interference) noise increases due to a phenomenon in which the current signal loops back via the differential transmission lines and terminating resistors.

DISCLOSURE OF THE INVENTION

The present invention is contrived in order to solve the above problems, and an object thereof is to provide a transmitting apparatus capable of suppressing the fluctuation of the common mode potential to perform high-speed, long-distance signal transmission.

A transmitting apparatus according to the present invention is a transmitting apparatus for transmitting a digital signal by changing the direction of flow of a current signal that is output to a pair of resistor-terminated differential transmission lines, the transmitting apparatus having: (1) a main buffer circuit, which has a first main output terminal and a second main output terminal connected to the differential transmission lines, outputs a current signal flowing from the first main output terminal to the second main output terminal via the differential transmission lines when a digital signal to be transmitted is at an H level, and outputs a current signal flowing from the second main output terminal to the first main output terminal via the differential transmission lines when the digital signal to be transmitted is at an L level; and (2) a pre-emphasis buffer circuit, which has a first output terminal connected to the first main output terminal, a second output terminal connected to the second main output terminal, a first current source and a second current source each generating a constant current, and a switch circuit for switching the relation of connection among the first current source, the second current source, the first output terminal, and the second output terminal. The pre-emphasis buffer circuit provided in the transmitting apparatus (a) connects, by means of the switch circuit, the first current source and the first output terminal to each other and connects the second current source and the second output terminal to each other, to thereby output a current signal flowing from the first output terminal to the second output terminal via the differential transmission lines, and (b) connects, by means of the switch circuit, the first current source and the second output terminal to each other and connects the second current source and the first output terminal to each other, to thereby output a current signal flowing from the second output terminal to the first output terminal via the differential transmission lines.

In this transmitting apparatus, the first main output terminal of the main buffer circuit and the first output terminal of the pre-emphasis buffer circuit are connected to each other, the second main output terminal of the main buffer circuit and the second output terminal of the pre-emphasis buffer circuit are connected to each other, and these output terminals are connected to the pair of resistor-terminated differential transmission lines. In the main buffer circuit, a current signal flowing from the first main output terminal to the second main output terminal via the differential transmission lines is output when a digital signal to be transmitted is at the H level, and a current signal flowing from the second main output terminal to the first main output terminal via the differential transmission lines is output when the digital signal to be transmitted is at the L level. In the pre-emphasis buffer circuit, the switch circuit is used to connect the first current source and the first output terminal to each other and to connect the second current source and the second output terminal to each other, whereby a current signal flowing from the first output terminal to the second output terminal via the differential transmission lines is output. Moreover, in the pre-emphasis buffer circuit, the switch circuit is used to connect the first current source and the second output terminal to each other and to connect the second current source and the first output terminal to each other, whereby a current signal flowing from the second output terminal to the first output terminal via the differential transmission lines is output.

Preferably, (a) during a certain time interval starting from a time point when the level of the digital signal to be transmitted is switched from the L level to the H level (referred to as "first time interval" hereinafter), the pre-emphasis buffer circuit connects the first current source and the first output terminal to each other and connects the second current source and the second output terminal to each other by means of the switch circuit to output the current signal flowing from the first output terminal to the second output terminal via the differential transmission lines, (b) during a certain time interval starting from a time point when the level of the digital signal to be transmitted is switched from the H level to the L level (referred to as "second time interval" hereinafter), the pre-emphasis buffer circuit connects the first current source and the second output terminal to each other and connects the second current source and the first output terminal to each other by means of the switch circuit to output the current signal flowing from the second output terminal to the first output terminal via the differential transmission lines, and (c) during a time interval other than the first time interval and the second time interval (referred to as "third time interval" hereinafter), the pre-emphasis buffer circuit separates the first current source from both the first output terminal and the second output terminal, and separates the second current source from both the first output terminal and the second output terminal by means of the switch circuit.

In this case, during a certain time interval starting at a time point when the level of the digital signal to be transmitted changes (the first time interval or the second time interval), the current signal that is output from the transmitting apparatus to the differential transmission lines becomes a current signal obtained by adding the current signal output from the pre-emphasis buffer circuit to the current signal output from the main buffer circuit, whereby the intensity of the obtained current signal increases. Therefore, the time that is taken until the magnitude of the current signal reaches a predetermined value after the level is inverted is reduced. On the other hand, during the third time interval, which is neither the first time interval nor the second time interval, both the first output terminal and the second output terminal of the pre-emphasis buffer circuit enter a high-impedance state, and the current signal that is output from the transmitting apparatus to the differential transmission lines is only the current signal that is output from the main buffer circuit. It should be noted that the characteristic of the main buffer circuit can be used as-is by keeping the first output terminal and the second output terminal of the pre-emphasis buffer circuit in the high-impedance state at all times.

It is preferred that the pre-emphasis buffer circuit further have a voltage-holding circuit that keeps a potential of a connection point (referred to as "first connection point" hereinafter) between the first current source and the switch circuit constant, and keeps a potential of a connection point (referred to as "second connection point") between the second current source and the switch circuit constant, during the third time interval. In this case, during the third time interval in which the outputs of the pre-emphasis buffer circuit are in the high-impedance state, the voltage-holding circuit keeps the potential of the connection point between the first current source and the switch circuit (first connection point) constant, and keeps the potential of the connection point between the second current source and the switch circuit (second connection point) constant, thus stabilization of the common mode potential can be achieved.

It is preferred that the switch circuit provided in the pre-emphasis buffer circuit have: a first switch provided between the first connection point and the first output terminal; a second switch provided between the first connection point and the second output terminal; a third switch provided between the second connection point and the first output terminal; and a fourth switch provided between the second connection point and the second output terminal. It is preferred that the voltage-holding circuit provided in the pre-emphasis buffer circuit have: a fifth switch that performs switching operation opposite to switching operation performed by the first switch; a sixth switch that performs switching operation opposite to switching operation performed by the second switch; a seventh switch that performs switching operation opposite to switching operation performed by the third switch; an eighth switch that performs switching operation opposite to switching operation performed by the fourth switch; a first resistor provided between a first end of the fifth switch and a first end of the seventh switch; and a second resistor provided between a first end of the sixth switch and a first end of the eighth switch, wherein a second end of the fifth switch and a second end of the sixth switch are connected to the first connection point, and a second end of the seventh switch and a second end of the eighth switch are connected to the second connection point. In this case, only during the third time interval in which the outputs of the pre-emphasis buffer circuit are in the high-impedance state, current flows to both the first resistor and the second resistor provided in the voltage-holding circuit, and the potentials of the first connection point and the second connection point are constant. It is preferred that each of the first through eighth switches be configured by, for example, a MOS transistor.

It is preferred that resistance values of the first resistor and second resistor provided in the voltage-holding circuit be twice a value of terminating resistance of the differential transmission lines. Also, preferably, a resistance value that is obtained when each of the fifth through eighth switches is in an on-state is twice a resistance value obtained when each of the first through fourth switches is in the on-state. In this case, when the outputs of the pre-emphasis buffer circuit are in any state, the potentials of the first connection point and the second connection point become substantially constant, thus even when an output state fluctuates, the fluctuation of the common mode potential can be diminished.

According to the present invention, fluctuation of the common mode potential can be prevented and high-speed, long-distance signal transmission can be performed.

BRIEF DESCRIPTION OF THE DRAWINGS

FIG. 7 is a chart that compiles the relationship between an output state of the pre-emphasis buffer circuit 20 and the levels of an INPp signal, an INPn signal, an INNp signal, and an INNn signal;

FIG. 9 is a chart that compiles the relationship among the output state of the pre-emphasis buffer circuit 20, the levels of the INPp signal, INPn signal, INNp signal, and INNn signal, and a state of the voltage-holding circuit 24 (whether or not current flows to resistors 245, 246);

FIG. 15 is a timing chart for explaining an operation of the data conversion circuit 30 shown in FIG. 13.

Figure 1:
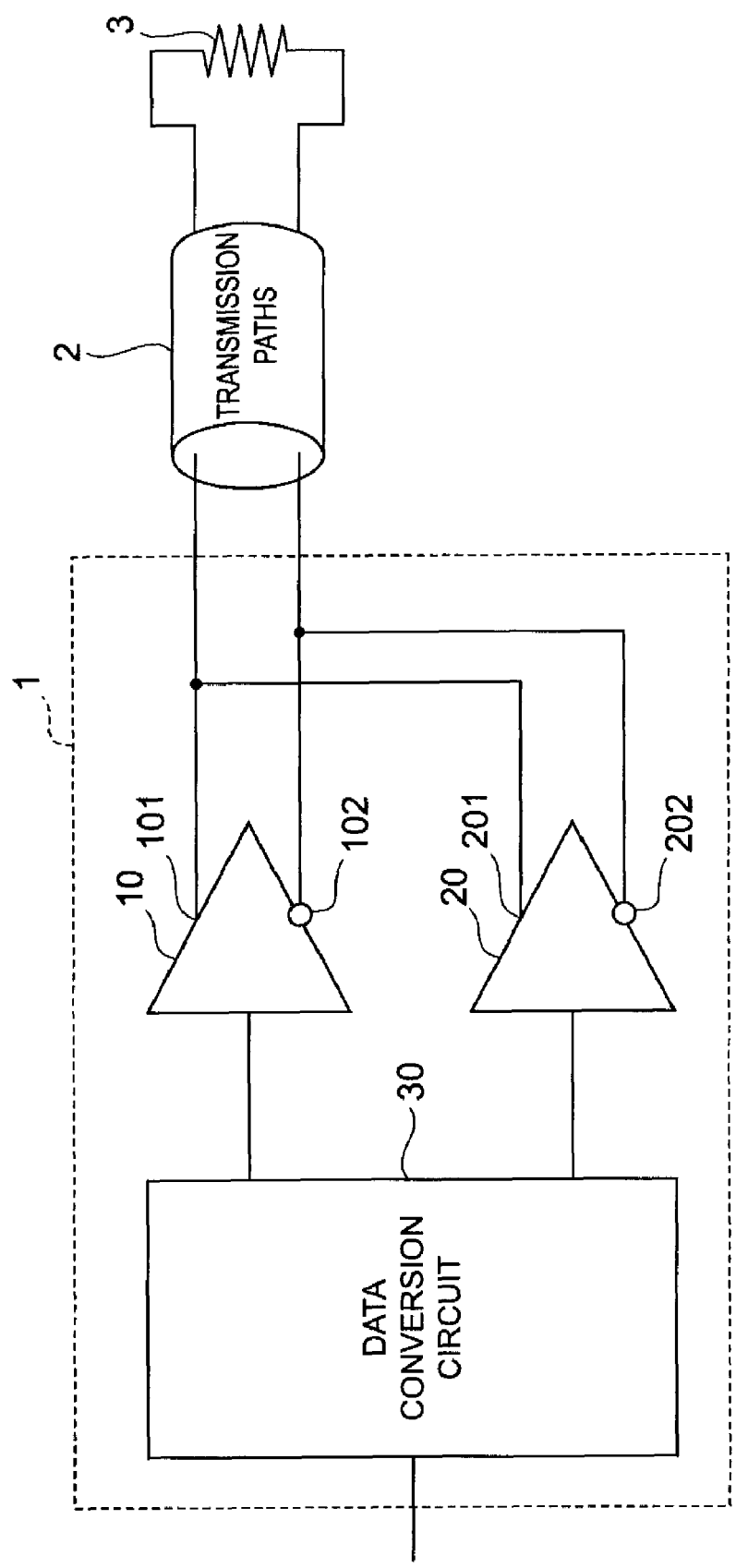
FIG. 1 is a schematic configuration diagram of a transmitting apparatus 1 according to a present embodiment.

EXPLANATION OF REFERENCE NUMERALS 1 transmitting apparatus
2 a pair of differential transmission lines
3 terminating resistor
10 main buffer circuit
11 switch circuit
12 current source
13 resistor
20 pre-emphasis buffer circuit
21 switch circuit
22 first current source
23 second current source
24 voltage-holding circuit
25 reference voltage generating circuit
30 data conversion circuit
31 through 33 multiplexers
34 edge detection circuit

BEST MODE FOR CARRYING OUT THE INVENTION

Hereinafter, the best mode for carrying out the present invention is described in detail with reference to the attached drawings. It should be noted that the same reference numerals are assigned to the same elements in the explanations of the drawings, and redundant explanations are omitted.

Figure 2:
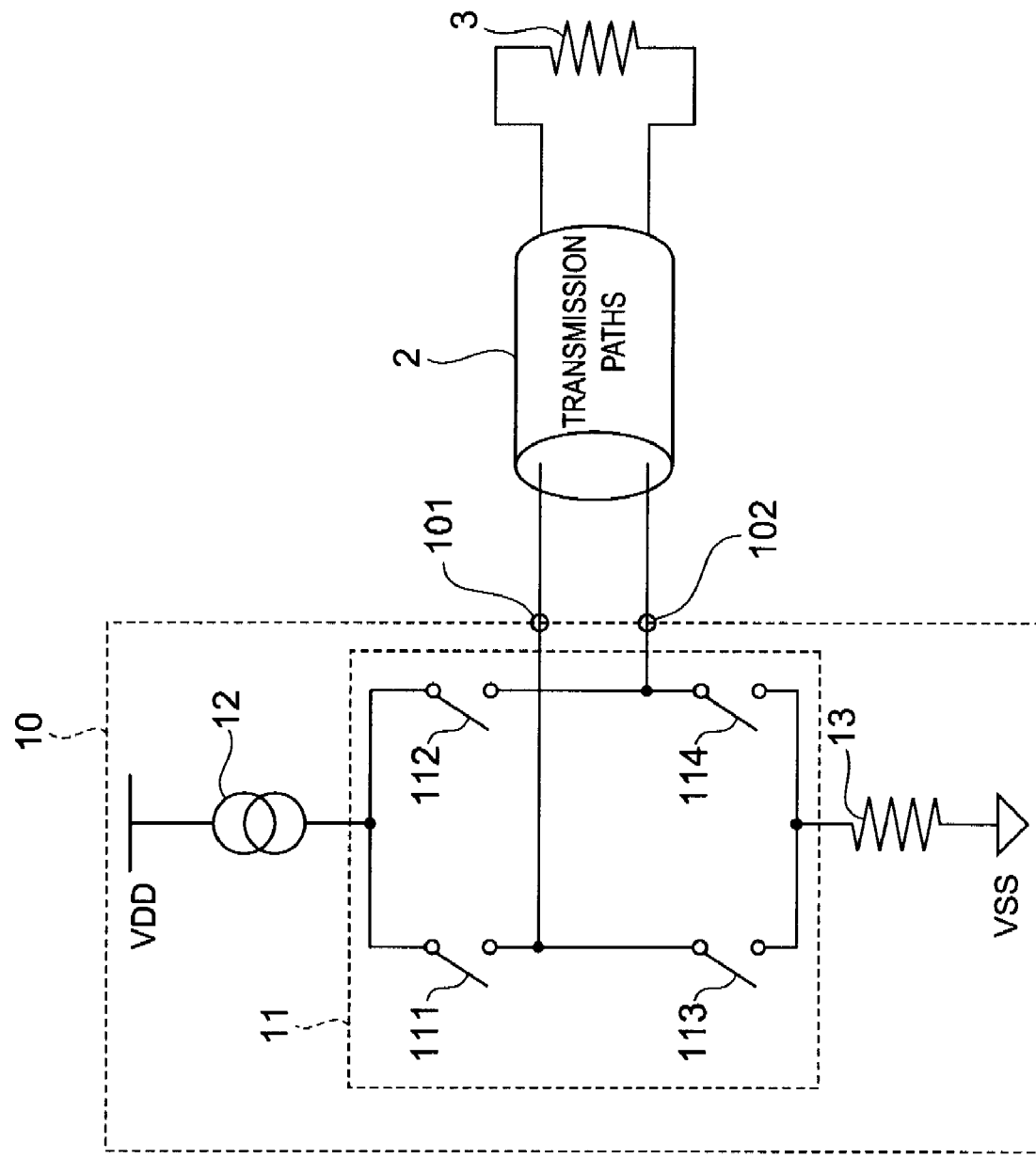
FIG. 2 is a schematic diagram of a main buffer circuit 10 provided in the transmitting apparatus 1 according to the present embodiment.
Figure 3:
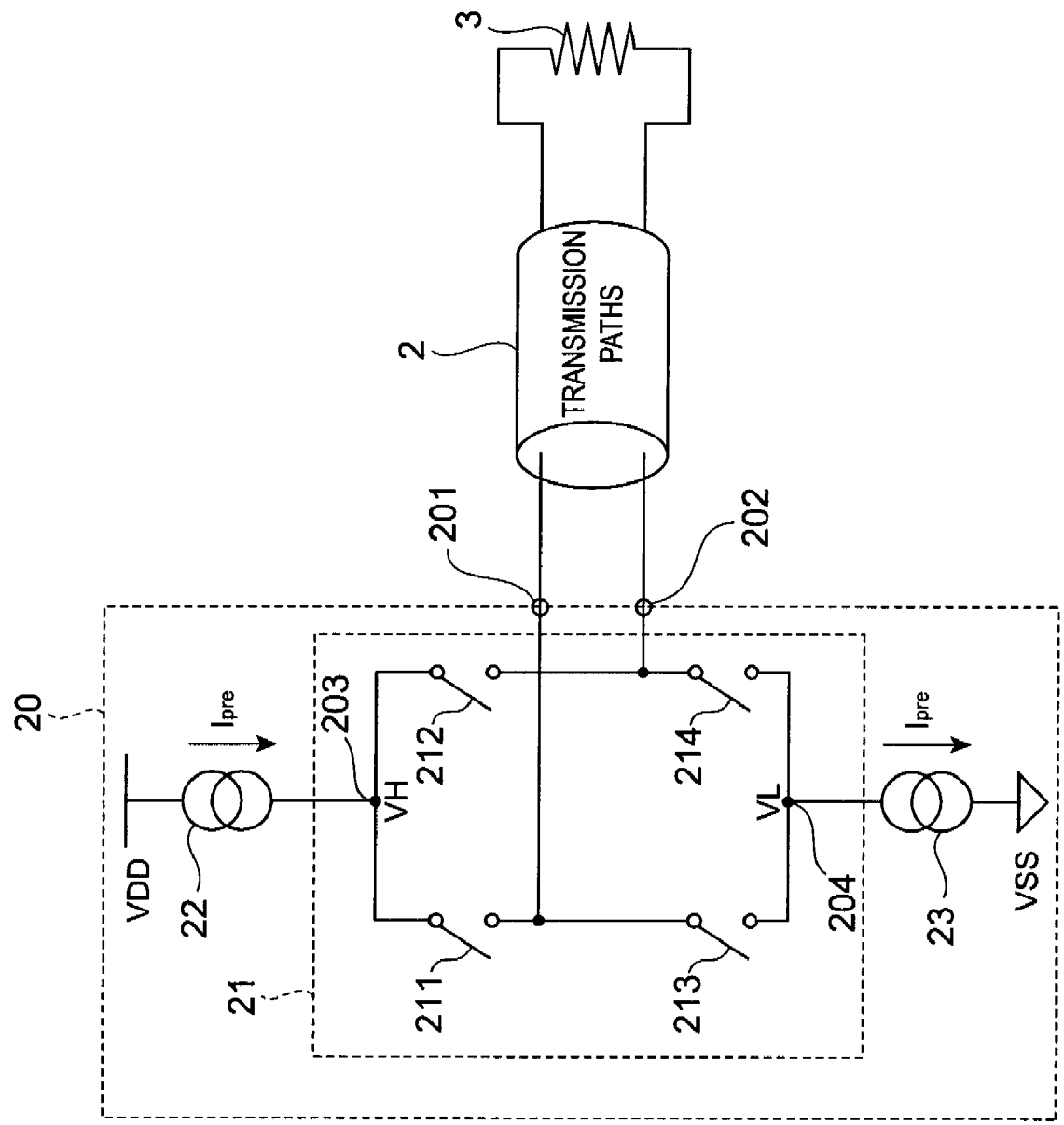
FIG. 3 is a schematic diagram of a pre-emphasis buffer circuit 20 provided in the transmitting apparatus 1 according to the present embodiment.

First of all, a schematic configuration of the transmitting apparatus 1 according to the present embodiment is described using FIG. 1 through FIG. 3. FIG. 1 is a schematic configuration diagram of the transmitting apparatus 1 according to the present embodiment. FIG. 2 is a schematic diagram of the main buffer circuit 10 provided in the transmitting apparatus 1 according to the present embodiment. FIG. 3 is a schematic diagram of the pre-emphasis buffer circuit 20 provided in the transmitting apparatus 1 according to the present embodiment. It should be noted that these drawings show a pair of differential transmission lines 2 to which the transmitting apparatus 1 outputs current signals, and a resistor 3 located at the end of the pair of differential transmission lines 2.

As shown in FIG. 1, the transmitting apparatus 1 according to the present embodiment transmits digital signals by changing the directions of current signals that are output to the differential signal transmission path pair 2 which is resistor-terminated at the resistor 3, and has the main buffer circuit 10, the pre-emphasis buffer circuit 20, and a data conversion circuit 30.

The main buffer circuit 10 has a first main output terminal 101 and a second main output terminal 102 that are connected to the differential transmission lines 2. When a digital signal to be transmitted is at an H level, the main buffer circuit 10 outputs a current signal that flows from the first main output terminal 101 to the second main output terminal 102 via the differential transmission lines 2. Furthermore, when the digital signal to be transmitted it at an L level, the main buffer circuit 10 outputs a current signal that flows from the second main output terminal 102 to the first main output terminal 101 via the differential transmission lines 2.

The pre-emphasis buffer circuit 20 has a first output terminal 201 that is connected to the first main output terminal 101 of the main buffer circuit 10, and a second output terminal 202 that is connected to the second main output terminal 102 of the main buffer circuit 10. The pre-emphasis buffer circuit 20 can output a current signal flowing from the first output terminal 201 to the second output terminal 202 via the differential transmission lines 2, and a current signal flowing from the second output terminal 202 to the first output terminal 201 via the differential transmission lines 2, and can also bring both the first output terminal 201 and the second output terminal 202 into a high-impedance (High-Z) state.

The data conversion circuit 30 inputs a digital signal to be transmitted, as parallel data, converts this parallel data into serial data, and outputs this serial data to the main buffer circuit 10. The main buffer circuit 10 to which the serial data is input switches the directions of the current signals output to the differential transmission lines 2, depending on whether the data is at the H level or the L level.

Furthermore, the data conversion circuit 30 generates data in response to the level change of the serial data, and outputs the generated data to the pre-emphasis buffer circuit 20. The pre-emphasis buffer circuit 20 to which the data is input can switch the directions of the current signals to be output to the differential transmission lines 2, or bring both the first output terminal 201 and the second output terminal 202 into the High-Z state, according to the data.

As shown in FIG. 2, the main buffer circuit 10 has a switch circuit 11, a current source 12, and a resistor 13. The current source 12 is provided between a power source potential VDD on the high potential side and the switch circuit 11. The resistor 13 is provided between a power source potential VSS on the low potential side and the switch circuit 11. The switch circuit 11 switches the relation of connection among the current source 12, the resistor 13, the first main output terminal 101 and the second main output terminal 102, and has a first switch 111, a second switch 112, a third switch 113 and a fourth switch 114. Each of these four switches 111 through 114 can be realized by, for example, a transistor.

The first switch 111 and the third switch 113 are connected to each other, the connection point therebetween is connected to the first main output terminal 101, the other end of the first switch 111 is connected to the current source 12, and the other end of the third switch 113 is connected to the resistor 13. Also, the second switch 112 and the fourth switch 114 are connected to each other, the connection point therebetween is connected to the second main output terminal 102, the other end of the second switch 112 is connected to the current source 12, and the other and of the fourth switch 114 is connected to the resistor 13.

In the min buffer circuit 10 the first switch 111 and the fourth switch 114 perform switching operation at the same time. The second switch 112 and the third switch 113 perform switching operation at the same time. Each of the first switch 111 and the fourth switch 114 performs switching operation opposite to the switching operation performed by each of the second switch 112 and the third switch 113.

Specifically, when the digital signal to be transmitted is at the H level, the first switch 111 and the fourth switch 114 are closed while the second switch 112 and the third switch 113 are opened, whereby the current source 12 is connected to the first main output terminal 101 via the first switch 111, and the resistor 13 is connected to the second main output terminal 102 via the fourth switch 114. The current generated by the current source 12 flows to the resistor 13 via the first switch 111, the first main output terminal 101, the differential transmission lines 2, the second main output terminal 102, and the fourth switch 114 in sequence.

On the other hand, when the digital signal to be transmitted is at the L level, the first switch 111 and the fourth switch 114 are opened while the second switch 112 and the third switch 113 are closed, whereby the current source 12 is connected to the second main output terminal 102 via the second switch 112, and the resistor 13 is connected to the first main output terminal 101 via the third switch 113. The current generated by the current source 12 flows to the resistor 13 via the second switch 112, the second main output terminal 102, the differential transmission lines 2, the first main output terminal 101, and the third switch 113 in sequence.

As shown in FIG. 3, the pre-emphasis buffer circuit 20 has a switch circuit 21, a first current source 22 and a second current source 23. The first current source 22 and the second current source 23 each generate a constant current $I_{pre}$. The first current source 22 is provided between a power source potential VDD on the high potential side and the switch circuit 21. The second current source 23 is provided between a power source potential VSS on the low potential side and the switch circuit 21. The switch circuit 21 switches the relation of connection among the first current source 22, the second current source 23, the first output terminal 201 and the second output terminal 202, and has a first switch 211, a second switch 212, a third switch 213 and a fourth switch 214. Each of these four switches 211 through 214 can be realized by, for example, a transistor.

The first switch 211 and the third switch 213 are connected to each other, the connection point therebetween is connected to the first output terminal 201, the other end of the first switch 211 is connected to the first current source 22, and the other end of the third switch 213 is connected to the second current source 23. Also, the second switch 212 and the fourth switch 214 are connected to each other, the connection point therebetween is connected to the second output terminal 202, the other end of the second switch 212 is connected to the first current source 22, and the other and of the fourth switch 214 is connected to the second current source 23.

Specifically, the first switch 211 is provided between a first connection point 203 and the first output terminal 201, the second switch 212 is provided between the first connection point 203 and the second output terminal 202, the third switch 213 is provided between a second connection point 204 and the first output terminal 201, and the fourth switch 214 is provided between the second connection point 204 and the second output terminal 202. It should be noted that the first connection point 203 is a point of connection between the first current source 22 and the switch circuit 21, and the second connection point 204 is a point of connection between the second current source 23 and the switch circuit 21.

In the pre-emphasis buffer circuit 20 the first switch 211 and the fourth switch 214 perform switching operation at the same time. The second switch 212 and the third switch 213 perform switching operation at the same time. Each of the first switch 211 and the fourth switch 214 performs switching operation opposite to switching operation performed by each of the second switch 212 and the third switch 213. Alternatively, there is a case in which all of these four switches 211 through 214 are opened at the same time.

Specifically, the first switch 211 and the fourth switch 214 are closed while the second switch 212 and the third switch 213 are opened, whereby the first current source 22 is connected to the first output terminal 201 via the first switch 211, and the second current source 23 is connected to the second output terminal 202 via the fourth switch 214. The current $I_{pre}$ generated by the current sources 22, 23 flows the first switch 211, the first output terminal 201, the differential transmission lines 2, the second output terminal 202, and the fourth switch 214 in sequence.

On the other hand, by opening the first switch 211 and the fourth switch 214 and closing the second switch 212 and the third switch 213, the first current source 22 is connected to the second output terminal 202 via the second switch 212, and the second current source 23 is connected to the first output terminal 201 via the third switch 213. The current $I_{pre}$ generated by the current sources 22, 23 flows the second switch 212, the second output terminal 202, the differential transmission lines 2, the first output terminal 201, and the third switch 213 in sequence.

Moreover, when all of the four switches 211 through 214 are opened, the first output terminal 201 and the second output terminal 202 each can be brought into the High-Z state.

Figure 4:
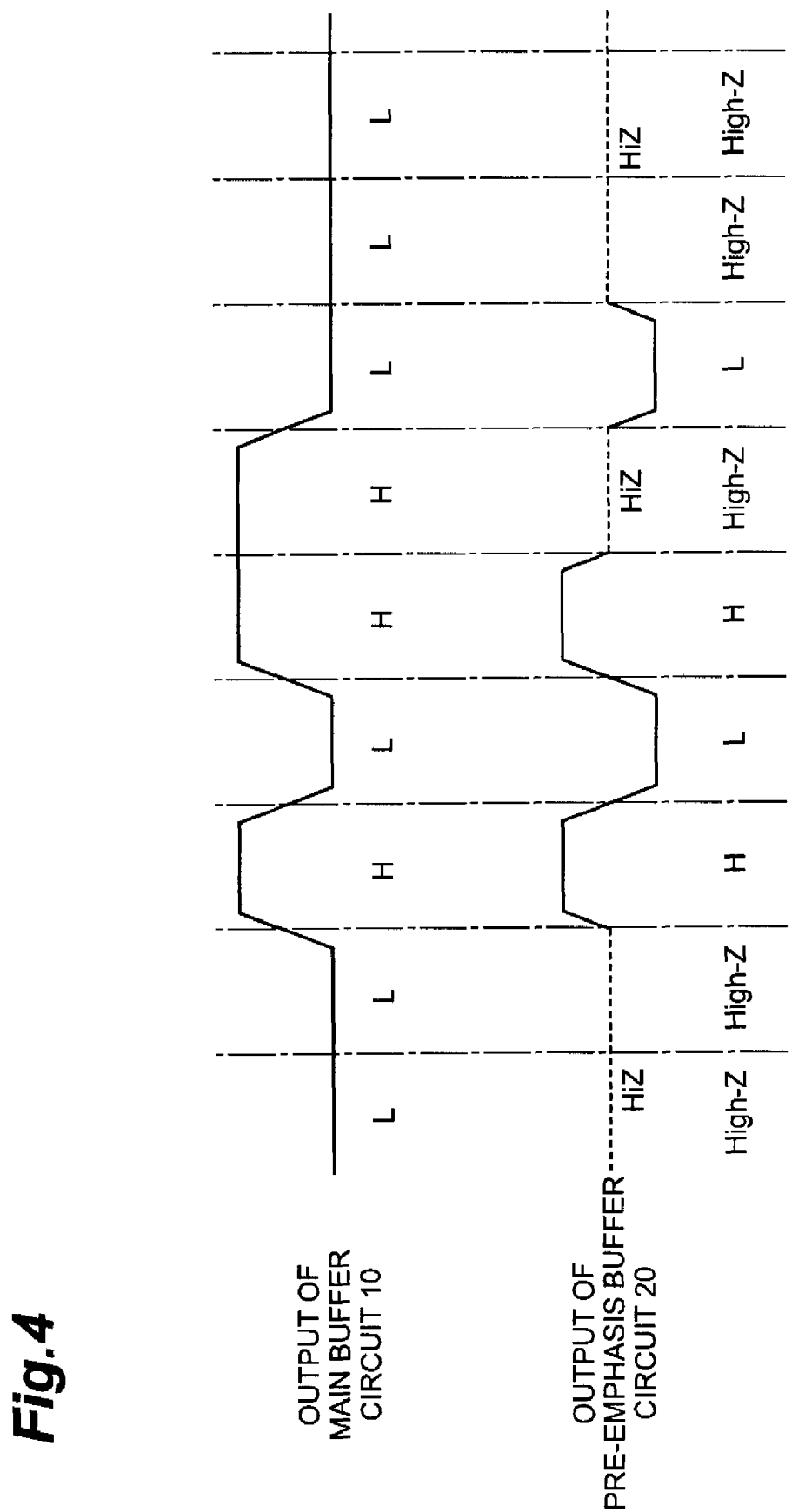
FIG. 4 is a timing chart of current signals that are output from the main buffer circuit 10 and the pre-emphasis buffer circuit 20 respectively.
Figure 5:
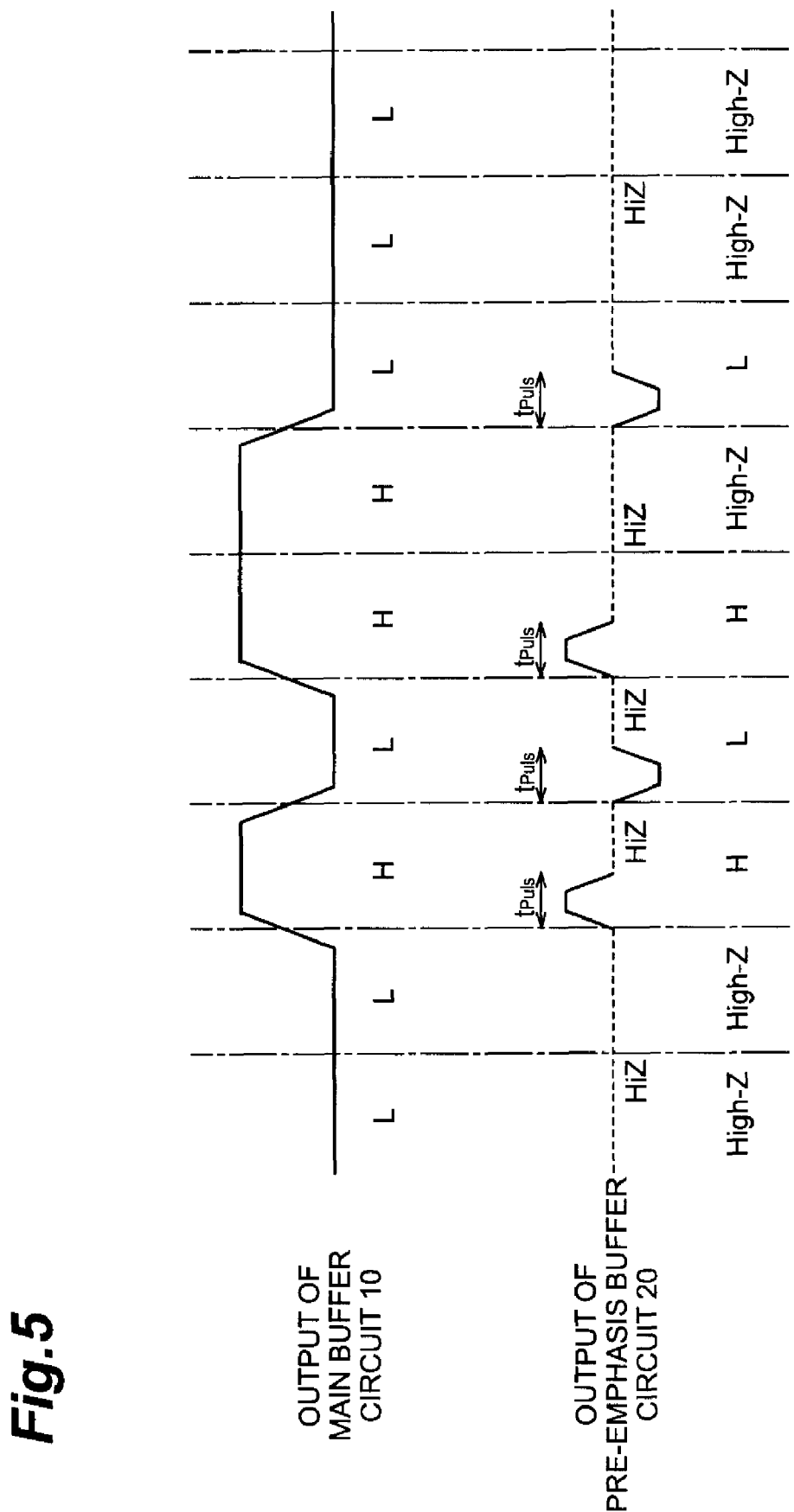
FIG. 5 is a timing chart of current signals that are output from the main buffer circuit 10 and the pre-emphasis buffer circuit 20 respectively.

Next, the operation of the pre-emphasis buffer circuit 20 provided in the transmitting apparatus 1 of the present embodiment is described using FIG. 4 and FIG. 5. FIG. 4 and FIG. 5 are each a timing chart of current signals that are output from the main buffer circuit 10 and the pre-emphasis buffer circuit 20 respectively. In both FIG. 4 and FIG. 5, when the digital signal to be transmitted is at the H level, the main buffer circuit 10 outputs a current signal that flows from the first main output terminal 101 to the second main output terminal 102 via the differential transmission lines 2 (designated by an alphabet "H" in the drawings), and when the digital signal to be transmitted is at the L level, the main buffer circuit 10 outputs a current signal that flows from the second main output terminal 102 to the first main output terminal 101 via the differential transmission lines 2 (designated by an alphabet "L" in the drawings). It should be noted that the direction of flow of the current signal (H or L) that is output from the main buffer circuit 10 is constant in each cycle time interval.

Furthermore, in both FIG. 4 and FIG. 5, the pre-emphasis buffer circuit 20 connects the first current source 22 and the first output terminal 201 to each other and connects the second current source 23 and the second output terminal 202 to each other by means of the switch circuit 21, to thereby output a current signal flowing from the first output terminal 201 to the second output terminal 202 via the differential transmission lines 2 (designated by an alphabet "H" in the drawings) during a certain time interval starting from a time point when the digital signal to be transmitted is switched from the L level to the H level (a first time interval).

On the other hand, the pre-emphasis buffer circuit 20 connects the first current source 22 and the second output terminal 202 to each other and connects the second current source 23 and the first output terminal 201 to each other by means of the switch circuit 21, to thereby output a current signal flowing from the second output terminal 202 to the first output terminal 201 via the differential transmission lines 2 (designated by an alphabet "L" in the drawings) during a certain time interval starting from a time point when the level of the digital signal to be transmitted is switched from the L level to the H level (a second time interval).

Moreover, the pre-emphasis buffer circuit 20 disconnects, by means of the switch circuit 21, the first current source 22 from the first output terminal 201 and the second output terminal 202, further disconnects the second current source 23 from the first output terminal 201 and the second output terminal 202, and brings both the first output terminal 201 and the second output terminal 202 into the High-Z state (designated by "Hi-Z" in the drawings) during a time interval other than the first time interval and the second time interval (a third time interval). The level of the digital signal to be transmitted does not change during a time interval between the first time interval or the second time interval, which is immediately before the third time interval, and the third time interval.

However, in the first embodiment shown in FIG. 4 the length of each of the first and second time intervals is equal to the cycle time interval, while in the second embodiment shown in FIG. 5 the length of each of the first and second time intervals is shorter than the cycle time interval (designated by "$t_{Puls}$" in the drawing).

By operating the per-emphasis buffer circuit 20 in this manner, during a certain time interval (the first time interval or the second time interval) starting from a time point when the level of the digital signal to be transmitted changes, the current signals that are output from the transmitting apparatus 1 to the differential transmission lines 2 are obtained by adding the current signal output from the pre-emphasis buffer circuit 20 to the current signal output from the main buffer circuit 10, whereby the intensity increases. Therefore, the time required for the magnitude of the current signal to reach a predetermined value after the level is changed is reduced.

On the other hand, during the third time interval, which is neither the first time interval nor the second time interval, the first output terminal 201 and the second output terminal 202 of the pre-emphasis buffer circuit 20 enter the high-impedance state, and the current signal that is output from the transmitting apparatus 1 to the differential transmission lines 2 is only the current signal that is output from the main buffer circuit 10.

Moreover, the pre-emphasis buffer circuit 20 has the first current source 22 on the current source side and the second current source 23 on the current sink side, and thereby has a high output impedance, and the potentials of the first connection point 203 and the second connection point 204 are practically not constant, thus the differential amplitude of the current signal to be output is constant to "$I_{pre} \times RL$," but the common mode potential is practically not determined. The RL is a resistance value of the terminating resistor 3.

Therefore, the outputs of the pre-emphasis buffer circuit 20 have no influence on the common mode potential that is output from the main buffer circuit 10, but have influence only on the amplitude of the current signal that is output to the differential transmission lines 2. For this reason, the transmitting apparatus 1 according to the present embodiment can use the main buffer circuit 10 having the conventional configuration, and has this main buffer circuit 10 and the pre-emphasis buffer circuit 20, so that the transmitting apparatus 1 can suppress the fluctuation of the common mode potential and perform high-speed, long-distance signal transmission.

In the transmitting apparatus 1 according to the present embodiment, the first output terminal 201 and second output terminal 202 of the pre-emphasis buffer circuit 20 are constantly held in the High-Z state, whereby the characteristic of the main buffer circuit 10 can be used as-is. Also, it is preferred that the intensity of the current signal to be output from the pre-emphasis buffer circuit 20 be adjusted in each of the first and second time intervals in accordance with the signal transmission rate or the characteristics of the differential transmission lines 2 so that the bit error rate obtained at the time of reception becomes optimal. In this manner, the transmitting apparatus 1 described above has the main buffer circuit 10, which changes the direction of main current supplied to the transmission paths 2 in accordance with the input digital signal level, and the pre-emphasis buffer circuit 20, which is connected in parallel with the main buffer circuit 10, changes the direction of auxiliary current supplied to the transmission paths 2 in accordance with the input digital signal level during a time interval including the time at which the input digital signal level is switched, and stops supplying the auxiliary current during the other time intervals.

Figure 6:
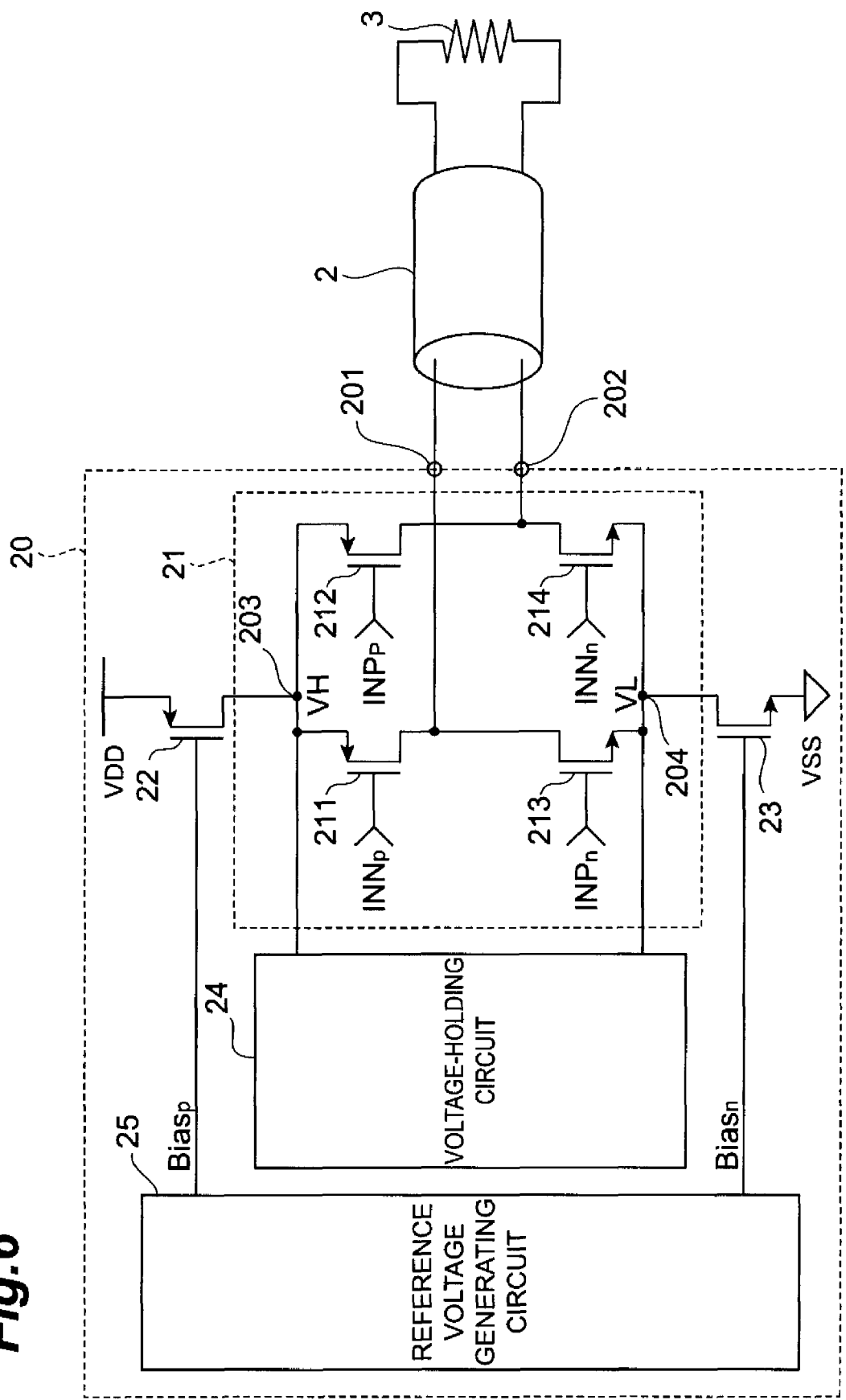
FIG. 6 is a circuit diagram of the pre-emphasis buffer circuit 20 provided in the transmitting apparatus 1 according to the present embodiment.

Next, a specific circuit configuration of the pre-emphasis buffer circuit 20 is described using FIG. 6 through FIG. 11. FIG. 6 is a circuit diagram of the pre-emphasis buffer circuit 20 provided in the transmitting apparatus 1 according to the present embodiment. In this drawing, the pre-emphasis buffer circuit 20 has a voltage-holding circuit 24 and a reference voltage generating circuit 25 in addition to the switch circuit 21, the first current source 22 and the second current source 23.

The switch circuit 21 has a PMOS transistor 211 as the first switch, a PMOS transistor 212 as the second switch, an NMOS transistor 213 as the third switch, and an NMOS transistor 214 as the fourth switch. A PMOS transistor 22 is provided as the first current source, and reference voltage $Bias_p$ output from the reference voltage generating circuit 25 is input to a gate terminal of the PMOS transistor 22, whereby the PMOS transistor 22 generates a constant current. Moreover, an NMOS transistor 23 is provided as the second current source, and reference voltage $Bias_n$ output from the reference voltage generating circuit 25 is input to a gate terminal of the NMOS transistor 23, whereby the NMOS transistor 23 generates a constant current.

A source terminal of the PMOS transistor 22 is connected to the power source potential VDD on the high potential side. A source terminal of the NMOS transistor 23 is connected to the power source potential VSS on the low potential side. A drain terminal of the PMOS transistor 22, a source terminal of the PMOS transistor 211, and a source terminal of the PMOS transistor 212 are connected to one another to constitute the first connection point 203. A drain terminal of the NMOS transistor 23, a source terminal of the NMOS transistor 213, and a source terminal of the NMOS transistor 214 are connected to one another to constitute the second connection point 204. A drain terminal of the PMOS transistor 211 and a drain terminal of the NMOS transistor 213 are connected to each other and to the first output terminal 201. A drain terminal of the PMOS transistor 212 and a drain terminal of the NMOS transistor 214 are connected to each other and to the second output terminal 202.

An INNp signal is input to a gate terminal of the PMOS transistor 211, an INPp signal is input to a gate terminal of the PMOS transistor 212, an INPn signal is input to a gate terminal of the NMOS transistor 213, and an INNn signal is input to a gate terminal of the NMOS transistor 214. Here, the levels of the INPp signal and the INPn signal are always opposite to each other, and the levels of the INNp signal and the INNn signal are always opposite to each other. The INPp signal, INPn signal, INNp signal and INNn signal are provided from the data conversion circuit 30 shown in FIG. 1.

FIG. 7 is a chart that compiles the relationship between an output state of the pre-emphasis buffer circuit 20 and the levels of the INPp signal, INPn signal, INNp signal, and INNn signal. This chart also shows a state of each of the transistors 211 through 214 ("on" or "off"). "On" means that the transistors functioning as the switches are in an on-state (closed state), while "off" means that the transistors functioning as the switches are in an off-state (opened state).

As shown in the chart, when the INPp signal, the INPn signal, the INNp signal and the INNn signal are respectively at the H level, the L level, the L level and the H level, the output state of the pre-emphasis buffer circuit 20 is in an H state (a state in which a current signal flows from the first output terminal 201 to the second output terminal 202 via the differential transmission lines 2). When the INPp signal, the INPn signal, the INNp signal and the INNn signal are respectively at the L level, the H level, the H level, and the L level, the output state of the pre-emphasis buffer circuit 20 is in an L state (a state in which a current signal flows from the second output terminal 202 to the first output terminal 201 via the differential transmission lines 2). Furthermore, when the INPp signal, the INPn signal, the INNp signal and the INNn signal are respectively at the H level, the L level, the H level and the L level, the output state of the pre-emphasis buffer circuit 20 is in the High-Z state.

Figure 8:
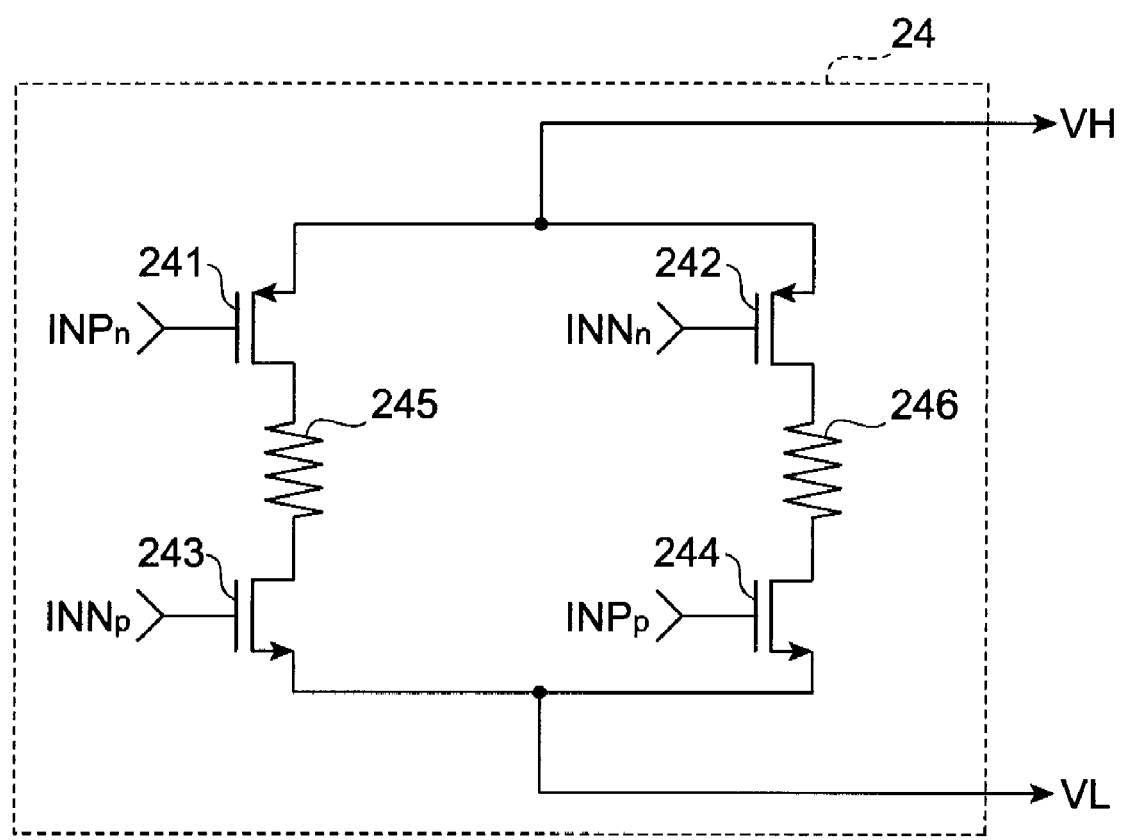
FIG. 8 is a circuit diagram of a voltage-holding circuit 24 provided in the pre-emphasis buffer circuit 20.

FIG. 8 is a circuit diagram of the voltage-holding circuit 24 provided in the pre-emphasis buffer circuit 20 shown in FIG. 6. The voltage-holding circuit 24 has a PMOS transistor 241 as the fifth switch, a PMOS transistor 242 as the sixth switch, an NMOS transistor 243 as the seventh switch, an NMOS transistor 244 as the eighth switch, a first resistor 245, and a second resistor 246.

A source terminal of the PMOS transistor 241 and a source terminal of the PMOS transistor 242 are connected to each other and to the first connection point 203 providing a potential VH. A source terminal of the NMOS transistor 243 and a source terminal of the NMOS 244 are connected to each other and to the second connection point 204 providing a potential VL. The resistor 245 is provided between a drain terminal of the PMOS transistor 241 and a drain terminal of the NMOS transistor 243. The resistor 246 is provided between a drain terminal of the PMOS transistor 242 and a drain terminal of the NMOS transistor 244.

The INPn signal is input to a gate terminal of the PMOS transistor 241, the INNn signal is input to a gate terminal of the PMOS transistor 242, the INNp signal is input to a gate terminal of the NMOS transistor 243, and the INPp is input to a gate terminal of the NMOS transistor 244.

FIG. 9 is a chart that compiles the relationship among the output state of the pre-emphasis buffer circuit 20, the levels of the INPp signal, INPn signal, INNp signal, and INNn signal that are input to the voltage-holding circuit 24, and a state of the voltage-holding circuit 24 (whether current flows to the resistors 245, 246). This chart also shows a state of each of the transistors 241 through 244 ("on" or "off"). "On" means that the transistors functioning as the switches are in the on-state (closed state), while "off" means that the transistors functioning as the switches are in the off-state (opened state).

As shown in the chart, the PMOS transistor 241 performs switching operation opposite to switching operation performed by the PMOS transistor 211. The PMOS transistor 242 performs switching operation opposite to switching operation performed by the PMOS transistor 212. The NMOS transistor 243 performs switching operation opposite to switching operation performed by the NMOS transistor 213. The NMOS transistor 244 performs switching operation opposite to switching operation performed by the NMOS transistor 214.

When the INPp signal, the INPn signal, the INbp signal and the INNn signal are respectively at the H level, the L level, the L level and the H level, the output state of the pre-emphasis buffer circuit 20 is in the H state, and no current flows to the resistors 245, 246. When the INPp signal, the INPn signal, the INNp signal and the INNn signal are respectively at the L level, the H level, the H level, and the L level, the output state of the pre-emphasis buffer circuit 20 is in the L state, and no current flows to the resistors 245, 246. Furthermore, when the INPp signal, the INPn signal, the INNp signal and the INNn signal are respectively at the H level, the L level, the H level and the L level, the output state of the pre-emphasis buffer circuit 20 is in the High-Z state, and current flows to the resistors 245, 246.

In this manner, current flows to the resistors 245, 246 only when the output state of the pre-emphasis buffer circuit 20 becomes the High-Z state, and the potential VH of the first connection point 203 and the potential VL of the second connection point 204 are each constant.

Particularly, it is preferred that the resistance values of the first resistor 245 and the second resistor 246 be twice the resistance value RL of the terminating resistor. Also, preferably, the resistance values obtained when the transistors 241 through 244 provided in the voltage-holding circuit 24 as the switches are in the on-state are twice the resistance values obtained when the transistors 211 through 214 provided in the switch circuit 21 as the switches are in the on-state. Accordingly, the potential VH of the first connection point 203 and the potential VL of the second connection point 204 are substantially constant when the output state of the pre-emphasis buffer circuit 20 is in any of the H, L and High-Z states, thus the fluctuation of the common mode potential can be minimized even when the output state fluctuates.

Moreover, the switch circuit 21 and the voltage-holding circuit 24 can deal with the INPp signal, INPn signal, INNp signal and INNn signal, thus these circuits are suitable in that the loads on the differentials are equalized.

As described above, during the third time interval in which the output state of the pre-emphasis buffer circuit 20 is in the High-Z state, the voltage-holding circuit 24 keeps the potential VH of the connection point between the first current source 22 and the switch circuit 21 (the first connection point 203) constant, and keeps the potential VL of the connection point between the second current source 23 and the switch circuit 21 (the second connection point 204) constant.

However, it is not necessary to provide the voltage-holding circuit 24. In this case, during the third time interval in which the output state of the pre-emphasis buffer circuit 20 is in the High-Z state, the first connection point 203 becomes the power source potential VDD on the high potential side, and the second connection point 204 becomes the power source potential VSS on the low potential side. It requires time for the potential of the first connection point 203 and of the second connection point 204 to be stabilized when the output state of the pre-emphasis buffer circuit 20 is changed from the H state or L state to the High-Z state, and there is a possibility that the common mode potential becomes unstable. On the other hand, there are advantages of low power consumption because no current flows during the third time interval, and small circuit dimension.

Figure 10:
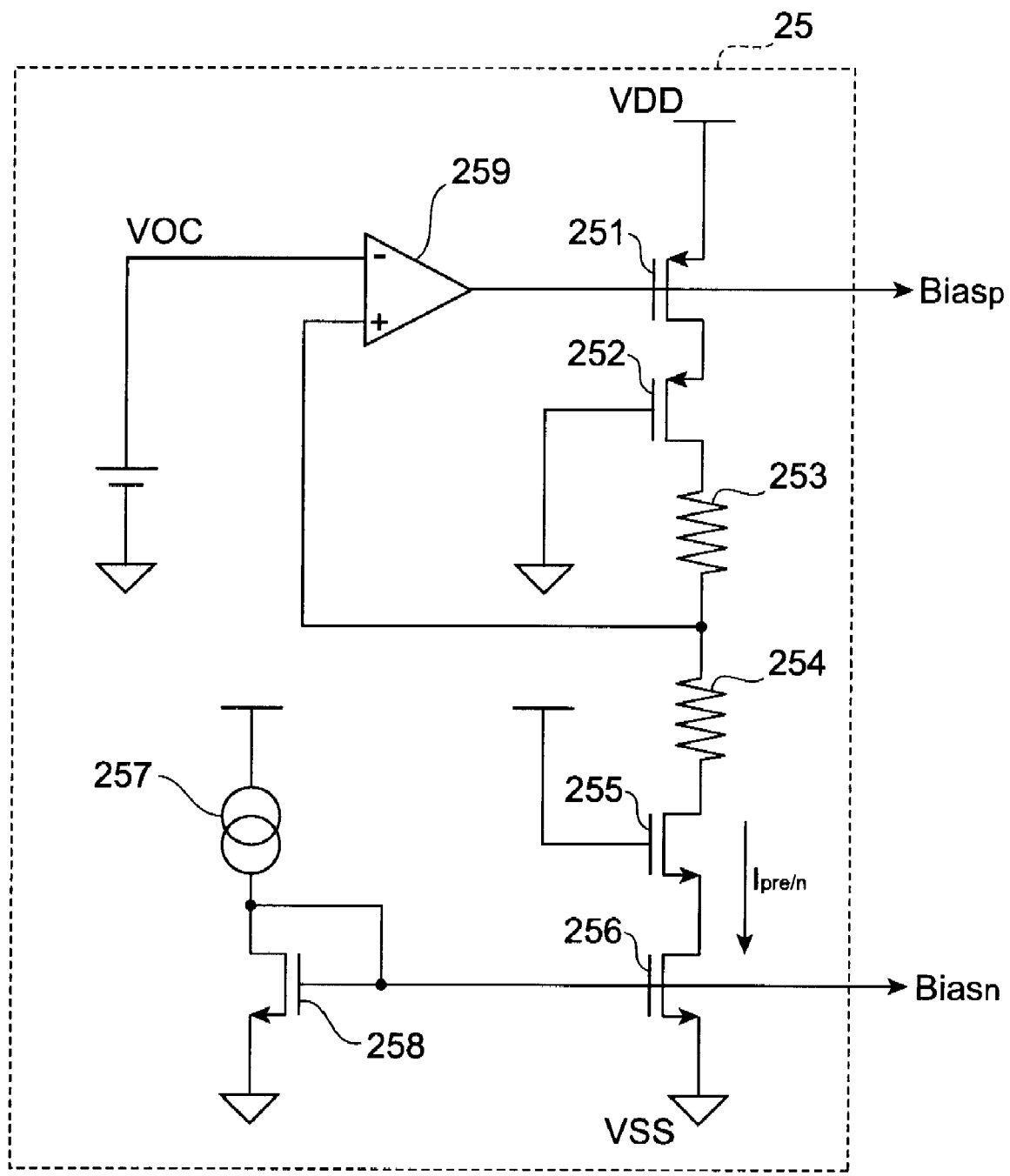
FIG. 10 is a circuit diagram of a reference voltage generating circuit 25 provided in the pre-emphasis buffer circuit 20.

FIG. 10 is a circuit diagram of the reference voltage generating circuit 25 provided in the pre-emphasis buffer circuit 20 shown in FIG. 6. The reference voltage generating circuit 25 shown in this diagram has a PMOS transistor 251, a PMOS transistor 252, a resistor 253, a resistor 254, an NMOS transistor 255, an NMOS transistor 256, a current source 257, a transistor (NMOS transistor in this example) 258, and an amplifier 259.

A source terminal of the PMOS transistor 251 is connected to the power source potential VDD on the high potential side. A source terminal of the PMOS transistor 252 is connected to a drain terminal of the PMOS transistor 251, and a gate terminal of the PMOS transistor 252 is connected to the power source potential VSS on the low potential side. The resistor 253 and the resistor 254 are connected to each other and provided between a drain terminal of the PMOS transistor 252 and a drain terminal of the NMOS transistor 255. A source terminal of the NMOS transistor 255 is connected to a drain terminal of the NMOS transistor 256, and a gate terminal of the NMOS transistor 255 is connected to the power source potential VDD on the high potential side. A source terminal of the NMOS transistor 256 is connected to the power source potential VSS on the low potential side.

The resistance value of the on-state PMOS transistor 251 is n times the resistance value of the on-state PMOS transistor 22 shown in FIG. 6. The resistance value of the on-state PMOS transistor 252 is n times the resistance value of each of the on-state PMOS transistors 211, 212. The resistance values of the resistor 253 and the resistor 254 are each n/2 times the resistance value RL of the terminating resistor 3. The resistance value of the on-state NMOS transistor 255 is n times the resistance value of each of the on-state NMOS transistors 213, 214. The resistance value of the on-state NMOS transistor 256 is n times the resistance value of the on-state NMOS transistor 23. The magnitude of the current flowing in a direction from the PMOS transistor 251 to the NMOS transistor 256 is set to $I_{pre}/n$. In this manner, the reference voltage generating circuit 25 has 1/n-size of a configuration that is similar to the configuration having the switch circuit 21, PMOS transistor 22, NMOS transistor 23 and terminating transistor 3. It should be noted that reference numeral n is a positive constant. The larger the value of n, the lower the power consumption of reference voltage generating circuit 25. For example, the value of n is set to 10.

The current source 257 is provided between the power source potential VDD on the high potential side and a drain terminal of the transistor 258. A source terminal of the transistor 258 is connected to the power source potential VSS on the low potential side. A gate terminal of the transistor 258 is connected to the drain terminal of the same, a gate terminal of the NMOS transistor 256, and the gate terminal of the NMOS transistor 23, and outputs the potentials of the connection points therebetween as $Bias_n$. These terminals form a current mirror circuit configuration, where current that is generated by the NMOS transistor 23 functioning as the second current source is $I_{pre}$.

An inverting input terminal of the amplifier 259 inputs a constant voltage value VOC. A non-inverting input terminal of the amplifier 259 is connected to a connection point between the resistor 253 and the resistor 254. An output terminal of the amplifier 259 is connected to a gate terminal of the PMOS transistor 251 and to the gate terminal of the PMOS transistor 22, and outputs the potentials of the connection points therebetween as $Bias_p$. Therefore, the current generated at the PMOS transistor 22 functioning as the first current source is $I_{pre}$. Also, the potential of the connection point between the resistor 253 and resistor 254 to which the non-inverting input terminal of the amplifier 259 is connected becomes equal to the constant voltage value VOC that is input to the non-inverting terminal of the amplifier 259, whereby the common mode potential becomes VOC.

The reference voltage generating circuit 25 configured in this manner can set the common mode potential VOC and the current $I_{pre}$ independently, and change the magnitude of the current $I_{pre}$, while keeping the common mode potential VOC constant.

Figure 11:
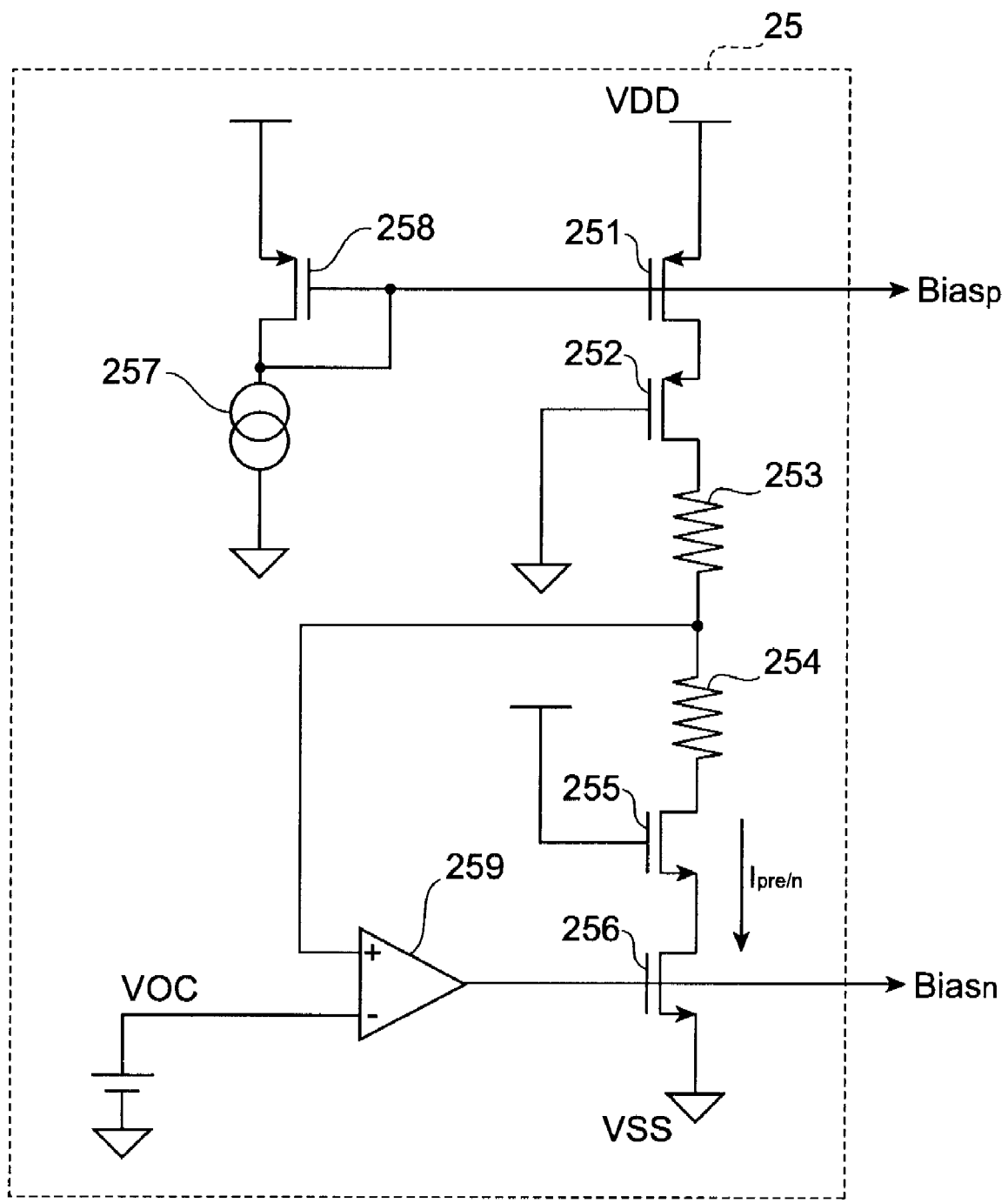
FIG. 11 is another circuit diagram of the reference voltage generating circuit 25 provided in the pre-emphasis buffer circuit 20.

FIG. 11 is another circuit diagram of the reference voltage generating circuit 25 provided in the pre-emphasis buffer circuit 20. The relation of connection among the current source 257, the transistor 258 and the amplifier 259 is different in the reference voltage generating circuit 25 shown in FIG. 11, compared to the configuration shown in FIG. 10.

In the configuration shown in FIG. 11, the current source 257 is provided between the power source potential VSS on the low potential side and the drain terminal of the transistor 258 (PMOS transistor in this example). The source terminal of the transistor 258 is connected to the power source potential VDD on the high potential side. The gate terminal of the transistor 258 is connected to the drain terminal of the same, the gate terminal of the PMOS transistor 251, and the gate terminal of the PMOS transistor 22, and outputs the potentials of the connection points therebetween as $Bias_p$. These terminals form a current mirror circuit configuration, where current generated by the PMOS transistor 22 functioning as the first current source is $I_{pre}$.

The inverting input terminal of the amplifier 259 inputs a constant voltage value VOC. The non-inverting input terminal of the amplifier 259 is connected to the connection point between the resistor 253 and the resistor 254. The output terminal of the amplifier 259 is connected to a gate terminal of the NMOS transistor 256 and to the gate terminal of the NMOS transistor 23, and outputs the potentials of the connection points therebetween as Biasn. Therefore, the current generated by the NMOS transistor 23 functioning as the second current source is $I_{pre}$. Also, the potential of the connection point between the resistor 253 and resistor 254 to which the non-inverting input terminal of the amplifier 259 is connected becomes equal to the constant voltage value VOC that is input to the non-inverting terminal of the amplifier 259, whereby the common mode potential becomes VOC.

The reference voltage generating circuit 25 configured in this manner also can set the common mode potential VOC and the current $I_{pre}$ independently, and change the magnitude of the current $I_{pre}$, while keeping the common mode potential VOC constant.

Next, a specific circuit configuration of the data conversion circuit 30 is described using FIG. 12 through FIG. 15.

Figure 12:
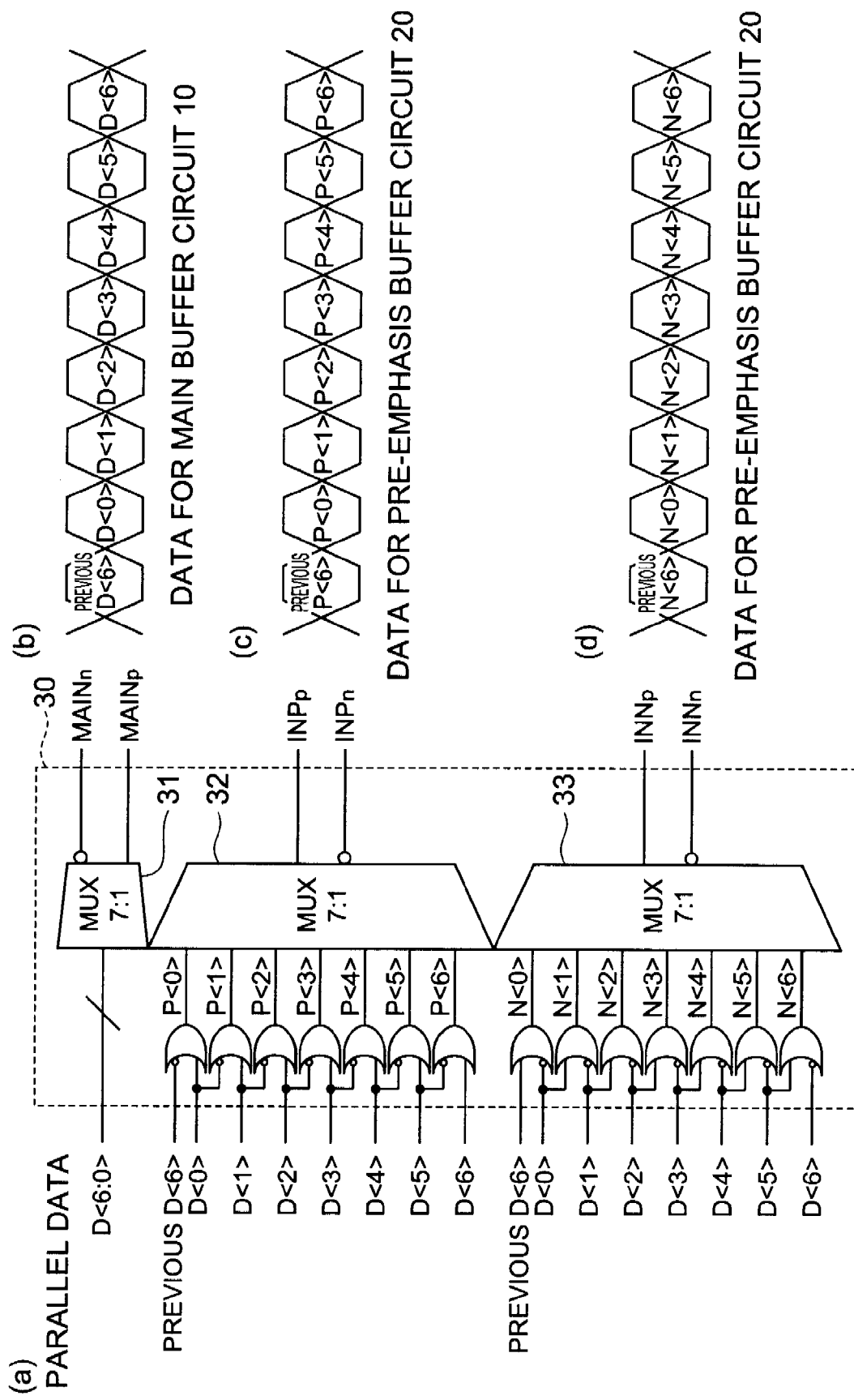
FIG. 12 is a diagram for explaining a data conversion circuit 30 provided in the transmitting apparatus 1, where (a) of FIG. 12 is a circuit diagram of the data conversion circuit 30, (b) of FIG. 12 is a timing chart of data for the main buffer circuit 10, (c) of FIG. 12 is a timing chart of data for the pre-emphasis buffer circuit 20, and (d) of FIG. 12 is a timing chart of the data for the pre-emphasis buffer circuit 20.

FIG. 12 is a diagram for explaining the data conversion circuit 30 provided in the transmitting apparatus 1, where (a) of FIG. 12 is a circuit diagram of the data conversion circuit 30, (b) of FIG. 12 is a timing chart of data for the main buffer circuit 10, (c) of FIG. 12 is a timing chart of data for the pre-emphasis buffer circuit 20, and (d) of FIG. 12 is a timing chart of the data for the pre-emphasis buffer circuit 20.

The data conversion circuit 30 shown in this figure generates and outputs the signals so that the main buffer circuit 10 and the pre-emphasis buffer circuit 20 perform the operations shown in FIG. 4. The data conversion circuit 30 has multiplexers 31 through 33. The multiplexer 31 inputs a digital signal to be transmitted, as parallel data D <6:0>, and outputs, sequentially, each bit of the parallel data D <0> through D <6> and the inverted data as a MAINp signal and a MAINn signal respectively ((b) of FIG. 12).

The multiplexer 32 inputs an OR value P <0> that is a logical sum of a logically inverted value of data D <6> and the value of the data D <0>, the data D <6>being the one before the data D <0>, an OR value P <1> that is a logical sum of a logically inverted value of the data D <0> and the value of the data D <1>, an OR value P <2> that is a logical sum of a logically inverted value of the data D <1> and the value of the data D <2>, an OR value P <3> that is a logical sum of a logically inverted value of the data D <2> and the value of the data D <3>, an OR value P <4> that is a logical sum of a logically inverted value of the data D <3> and the value of the data D <4>, an OR value P <5> that is a logical sum of a logically inverted value of the data D <4> and the value of the data D <5>, and an OR value P <6> that is a logical sum of a logically inverted value of the data D <5> and the value of the data D <6>, and outputs these data items P <0>through P <6> and the inverted data thereof sequentially as the INPp signal and the INPn signal respectively ((c) of FIG. 12).

The multiplexer 33 inputs an OR value P <0> that is a logical sum of the value of the data D <6> and the logically inverted value of the data D <0>, the data D <6> being the one before the data D <0>, an OR value N <1> that is a logical sum of the value of the data D <0> and the logically inverted value of the data D <1>, an OR value N <2> that is a logical sum of the value of the data D <1> and the logically inverted value of the data D <2>, an OR value N <3> that is a logical sum of the value of the data D <2> and the logically inverted value of the data D <3>, an OR value N <4> that is a logical sum of the value of the data D <3> and the logically inverted value of the data D <4>, an OR value N <5> that is a logical sum of the value of the data D <4> and the logically inverted value of the data D <5>, and an OR value N <6> that is a logical sum of the value of the data D <5> and the logically inverted value of the data D <6>, outputs these data items N <0> through N <6> and the inverted data thereof sequentially as the INNp signal and the INNn signal respectively ((d) of FIG. 12).

The MAINp signal and the MAINn signal that are output by the multiplexer 31 are signals for controlling the on and off of the switches 111 through 114 of the main buffer circuit 10. Also, the INPp signal, INPn signal, INNp signal and INNn signal that are output by the multiplexers 32, 33 are signals for controlling the on and off of the switches 211 through 214 of the pre-emphasis buffer circuit 20, as shown in FIG. 4.

Figure 13:
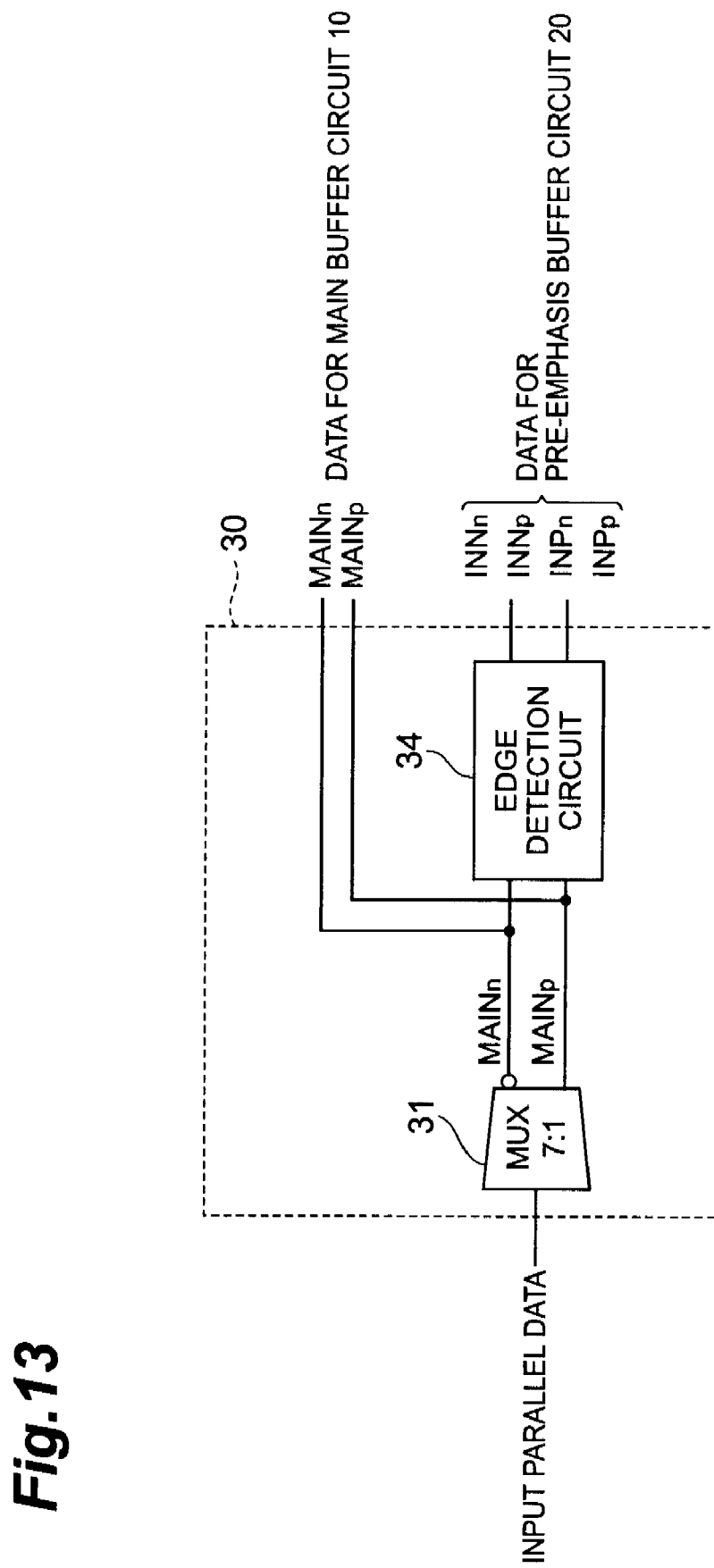
FIG. 13 is another circuit diagram of the data conversion circuit 30 provided in the transmitting apparatus 1 according to the present embodiment.
Figure 14:
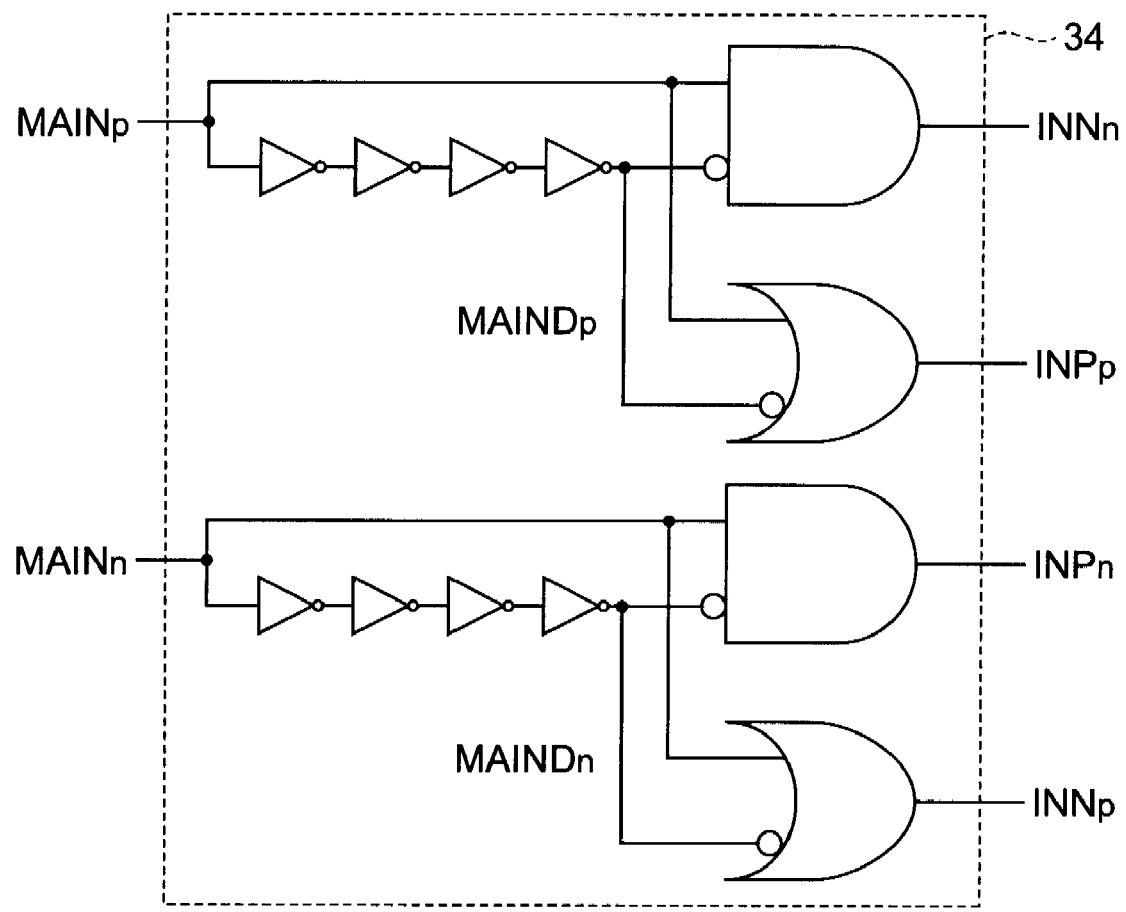
FIG. 14 is a circuit diagram of an edge detection circuit 34 of the data conversion circuit 30 shown in FIG. 13.

FIG. 13 is another circuit diagram of the data conversion circuit 30 provided in the transmitting apparatus 1 according to the present embodiment. FIG. 14 is a circuit diagram of an edge detection circuit 34 of the data conversion circuit 30 shown in FIG. 13. FIG. 15 is a timing chart for explaining an operation of the data conversion circuit 30 shown in FIG. 13. The data conversion circuit 30 shown in these drawings generates and outputs the signals so that the main buffer circuit 10 and the pre-emphasis buffer circuit 20 perform the operations shown in FIG. 5. The data conversion circuit 30 has the multiplexer 31 and the edge detection circuit 34. This multiplexer 31 is same as the one described with reference to FIG. 12.

The edge detection circuit 34 inputs the MAINp signal and the MAINn signal output from the multiplexer 31, and generates and outputs the INPp signal, INPn signal, INNp signal and INNn signal on the basis of these MAINp signal and MAINn signal. Specifically, the edge detection circuit 34 outputs a logical AND of a logically inverted value of a signal obtained by applying a delay to the MAINp signal by means of four inverter circuits (MAINDp signal) and the MAINp signal, as the INNn signal. The edge detection circuit 34 outputs a logical sum of the logically inverted value of the MAINDp signal and the MAINp signal as the INNp signal. The edge detection circuit 34 outputs a logical AND of a logically inverted value of a signal obtained by applying a delay to the MAINn signal by means of the four inverter circuits (MAINDn signal) and the MAINn signal, as the INPn signal. Moreover, the edge detection circuit 34 outputs a logical sum of the logically inverted value of the MAINDn signal and the MAINn signal as the INPp signal.

As shown in FIG. 15, the INPp signal, INPn signal, NNp signal, and INNn signal that are output by the edge detection circuit 34 become signals for controlling the on and off of the switches 211 through 214 of the pre-emphasis buffer circuit 20 as shown in FIG. 5.

INDUSTRIAL APPLICABILITY

The present invention can be utilized in a transmitting apparatus.

The invention claimed is:

1. A transmitting apparatus for transmitting a digital signal by changing a direction of flow of a current signal that is output to a pair of resistor-terminated differential transmission lines, the transmitting apparatus comprising:

a main buffer circuit, which has a first main output terminal and a second main output terminal connected to the differential transmission lines, outputs a current signal flowing from the first main output terminal to the second main output terminal via the differential transmission lines when a digital signal to be transmitted is at an H level, and outputs a current signal flowing from the second main output terminal to the first main output terminal via the differential transmission lines when the digital signal to be transmitted is at an L level; and a pre-emphasis buffer circuit, which has a first output terminal connected to the first main output terminal, a second output terminal connected to the second main output terminal, a first current source and a second current source each generating a constant current, and a switch circuit for switching the relation of connection among the first current source, the second current source, the first output terminal, and the second output terminal, wherein the pre-emphasis buffer circuit connects, by means of the switch circuit, the first current source and the first output terminal to each other and connects the second current source and the second output terminal to each other to output a current signal flowing from the first output terminal to the second output terminal via the differential transmission lines, and connects, by means of the switch circuit, the first current source and the second output terminal to each other and connects the second current source and the first output terminal to each other to output a current signal flowing from the second output terminal to the first output terminal via the differential transmission lines, wherein during a first time interval starting from a time point when the level of the digital signal to be transmitted is switched from the L level to the H level, the pre-emphasis buffer circuit connects the first current source and the first output terminal to each other and connects the second current source and the second output terminal to each other by means of the switch circuit to output the current signal flowing from the first output terminal to the second output terminal via the differential transmission lines, during a second time interval starting from a time point when the level of the digital signal to be transmitted is switched from the H level to the L level, the pre-emphasis buffer circuit connects the first current source and the second output terminal to each other and connects the second current source and the first output terminal to each other by means of the switch circuit to output the current signal flowing from the second output terminal to the first output terminal via the differential transmission lines, and during a third time interval other than the first time interval and the second time interval the pre-emphasis buffer circuit separates the first current source from both the first output terminal and the second output terminal, and separates the second current source from both the first output terminal and the second output terminal by means of the switch circuit, wherein the pre-emphasis buffer circuit further has a voltage-holding circuit that keeps a potential of a first connection point between the first current source and the switch circuit constant, and keeps a potential of a second connection point between the second current source and the switch circuit constant.

2. The transmitting apparatus according to claim 1, wherein the switch circuit has:

a first switch provided between the first connection point and the first output terminal;

a second switch provided between the first connection point and the second output terminal;

a third switch provided between the second connection point and the first output terminal; and a fourth switch provided between the second connection point and the second output terminal, the voltage-holding circuit has:

a fifth switch that performs switching operation opposite to switching operation performed by the first switch;

a sixth switch that performs switching operation opposite to switching operation performed by the second switch;

a seventh switch that performs switching operation opposite to switching operation performed by the third switch;

an eighth switch that performs switching operation opposite to switching operation performed by the fourth switch;

a first resistor provided between a first end of the fifth switch and a first end of the seventh switch; and a second resistor provided between a first end of the sixth switch and a first end of the eighth switch, a second end of the fifth switch and a second end of the sixth switch are connected to the first connection point, and a second end of the seventh switch and a second end of the eighth switch are connected to the second connection point.

3. The transmitting apparatus according to claim 2, wherein resistance values of the first resistor and the second resistor are twice a value of terminating resistance of the differential transmission lines, and a resistance value obtained when each of the fifth through eighth switches is in an on-state is twice a resistance value obtained when each of the first through fourth switches is in the on-state.

* * * * *